(12) United States Patent
Fasano et al.

(10) Patent No.: US 6,391,669 B1
(45) Date of Patent: May 21, 2002

(54) EMBEDDED STRUCTURES TO PROVIDE ELECTRICAL TESTING FOR VIA TO VIA AND INTERFACE LAYER ALIGNMENT AS WELL AS FOR CONDUCTIVE INTERFACE ELECTRICAL INTEGRITY IN MULTILAYER DEVICES

(75) Inventors: Benjamin V. Fasano, New Windsor; Hai P. Longworth; Vincent P. Peterson, III, both of Poughkeepsie; Anthony L. Plachy, Crompond; Robert N. Wiggin, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/598,426

(22) Filed: Jun. 21, 2000

(51) Int. Cl.[7] .......................... G01R 31/04; G01R 31/01
(52) U.S. Cl. ............................................ 438/18; 29/593
(58) Field of Search .............................. 438/14, 16, 17, 438/18, 401; 257/48, 797; 29/593, 825, 829, 830, 831, 832, 833, 834, 835, 836, 846, 851

(56) References Cited

U.S. PATENT DOCUMENTS

| | | | |
|---|---|---|---|
| 3,852,877 A | * | 12/1974 | Ahn et al. |
| 4,386,459 A | * | 6/1983 | Boulin |
| 4,441,075 A | | 4/1984 | McManon |
| 4,578,279 A | | 3/1986 | Zingher |
| 5,283,107 A | | 2/1994 | Bayer et al. |
| 5,756,146 A | | 5/1998 | Lee et al. |
| 5,863,446 A | | 1/1999 | Hanson |
| 5,916,715 A | | 6/1999 | Fulford, Jr. et al. |
| 6,118,137 A | * | 9/2000 | Fulford, Jr. et al. |
| 6,221,681 B1 | * | 4/2001 | Sugasawara |

\* cited by examiner

*Primary Examiner*—Tuan H. Nguyen
*Assistant Examiner*—Evan Pert
(74) *Attorney, Agent, or Firm*—Scully, Scott Murphy & Presser; Margaret A. Pepper

(57) ABSTRACT

Multilayer substrates, are fabricated with the incorporation therein of non-destructive test structures utilized to provide visual and electrical test data to facilitate the ascertainment and assessment of potential electrical interface failures. Furthermore, there are provided embedded structures in multilayer substrates, such as are employed in chip carrier packaging, so as to facilitate electrical testing for via to via alignment and interface layer alignment, and to enable the testing of conductive interface electrical integrity of multilayer electrical devices.

26 Claims, 5 Drawing Sheets

EMBEDDED STRUCTURES TO PROVIDE ELECTRICAL TESTING FOR VIA TO VIA AND INTERFACE LAYER ALIGNMENT AS WELL AS FOR CONDUCTIVE INTERFACE ELECTRICAL INTEGRITY IN MULTILAYER DEVICES

BACKGROUND OF THE INVENTION

1. Field of the Invention

The present invention relates to the fabrication of multilayer substrates, and more particularly pertains to the incorporation therein of non-destructive test structures utilized to provide visual and electrical test data to facilitate the ascertainment and assessment of potential electrical interface failures. Furthermore, the invention is directed to the provision of embedded structures in a multilayer substrate, such as employed in chip carrier packaging, so as to facilitate electrical testing for via to via alignment and interface layer alignment, and to enable the testing of conductive interface electrical integrity of multilayer electrical devices.

The invention is further directed to the provision of a novel method for the non-destructive testing of electrical integrity in multilayer devices and substrates, as well as implementing electrical testing for via to via alignment and interface layer alignment in multilayer substrates and electrical semiconductor devices, such as are employed in chip carrier packaging.

During the process for the building-up or fabricating of multilayer ceramic substrates there are produced critical electrical interfaces which exist on each layer and also between adjacent or superimposed layers. These interfaces are typically formed on dielectric layers known as greensheets and constitute vias and electrically conductive patterned features such as lines or mesh planes, each of which may have a capture pad or cap provided on their ends in order to increase the contact area with their respective adjoining electrically conductive circuit element. The alignment of each of these interfaces is extremely critical, especially inasmuch as ever narrower line widths and smaller vias are used to be able to increase the wiring density of an electrical device. Also, at high frequencies above 10 GHz, discontinuities in conductor surface features can degrade the electrical performance of signals. Misaligned conductor interfaces can act as such discontinuities and limit the high frequency performance of multilayer devices. Typical specifications permit no more than one-half the diameter of a via as the misregistration or offset between adjacent layers at any location within a laminate. After adjacent layers are laminated the misregistration is practically impossible to quantify within any laminate, unless slow and expensive x-ray tooling is utilized or more accurately if destructive analyses, such as cross-sectioning, are performed on the laminate. This is a time-consuming procedure and provides information concerning alignment between adjacent layers with regard to only a very small area of the substrate. Similarly, when any substrates are made on a single multilayer laminate the traceability of a substrate or of such type of electrical device, which has been found to be defective due to interlayer misalignment, back to the parent laminate is very difficult when serialization of each substrate on each laminate is not employed. Moreover, inasmuch as the laminate may have been subject to poor alignment of the layers in only one corner or small region thereof, not all parts may be defective, and some may be good. By the same account, a substrate or device which has been cross-sectioned and found to possess a good alignment between layers from the center of the laminate may provide false information since devices formed from the corners of the same laminate will typically be subjected to the greatest degree of misalignment from a layer which is slightly rotated during stack-up or lamination within the laminate.

There are also times during processing of cofired multilayer ceramic substrates when shrinkage mismatches between dielectric and conductor features particularly at line to via connections become distorted. This can produce electrical connections which can cause risks of electrical failure during thermal cycling due to CTE (coefficient of thermal expansion) mismatches between the dielectric and conductor.

In actual practice, proper alignment and complete area overlap at these interlayer interfaces is desired; however in reality, there is frequently encountered layer-to-layer misalignment due to greensheet movement during deposition of metallized features, often as organic based pastes, drying, handling, stacking, among other fabrication steps. Similarly, incomplete paste deposition can result in poor via fill. All of these factors can result in partial interlayer overlap with the potential for thermal expansion driven conductor-to-conductor electrical interface failure. This failure mode can be encountered with ceramic substrates when copper metallization, which has a very high coefficient of thermal expansion compared to most ceramics, is stressed during thermal cycling, fails and causes an electrical open. Severe conductor to via or inter layer via misalignment may also result in electrical shorting between metallized features. Likewise failures can be caused by manufacturing process violation of minimum feature separation requirements which may be required to ensure optimum electrical performance. Presently, there are no simple, reliable tests available for non-destructive detection as spacing violations in laminated parts. High-resistance shorts between metallized features can also influence the electrical performance of a semiconductor or electronic package. Ideally, there should be available a method to quickly and non-destructively determine whether an individual device, such as that resulting from the singulation of a multi-up laminate, has good alignment so as to provide an early screening for these types of defects.

2. Discussion of the Prior Art

Although various devices and methods have been developed in the technology for implementing the testing of the electrical integrity of semiconductor devices, particularly such as those which employ multilayer substrates possessing electrical interfaces, and which have electrical devices arranged on the surfaces thereof, including the testing of via to via alignment and layer interface alignment, these are primarily limited in scope and also fail to provide for the desirable kinds of non-destructive testing of these substrates and devices. Fulford, Jr. et al. U.S. Pat. No. 5,916,715 pertains to a process utilizing lithographically deposited metallized features in order to determine the layer alignment of these features for a multilayer substrate of a device. Each and every layer of the multilayer device requires multiple metallized features in order to provide a determination as to whether alignment is obtained within a specified range of microns. The testing which is implemented through the intermediary of this process is not employable for thick film alignment assessments inasmuch as it consumes considerable space on every greensheet layer during processing.

Hanson U.S. Pat. No. 5,863,446 describes an electrical arrangement for extracting layer to layer registration, wherein an alignment test feature is employed in an organic laminate for an electrical device. Resistors are positioned at strategic surface locations in order to determine lateral alignment of laser drilled conductive vias, such vias being produced in laminates requiring precise control of laser energy so as not to pierce the resistive layer which will be employed in order to assess the degree of misregistration, and necessitating precise placement of vias. It is difficult to produce laser holes in a fired ceramic substrate, and even more complex to be able to stop at a buried resistive layer and to subsequently metallize this via to a surface pad which can be probed for electrical integrity.

Lee et al. U.S. Pat. No. 5,756,146 discloses a method which permits optical inspection of metal lines in or on a transparent substrate. To the contrary, ceramic substrates, as well as most high performance chip carriers are not transparent and thus neither a laminated or sintered substrate as employed in the present construction would be suitable for the type of inspection testing disclosed in this patent.

Bayer et al. U.S. Pat. No. 5,283,107 relates to a process for producing a multilayer substrate with a prelaminated building block arrangement of wiring units to assemble a complete wiring pattern for each substrate. There is no test capability provided which will enable interlayer, intrablock or interblock alignment to be investigated nor for testing the integrity of adjacent through-vias, wiring traces or I/O (Input/Output) pads with regard to wiring continuity between selected electrically conductive surface elements and internal metallized features.

Zingher U.S. Pat. No. 4,578,279 relates to the inspection of multilayer ceramic circuit modules through the intermediary of electrical inspection of unfired greensheets. However, this does not enable implementation of any alignment test features to quantify alignment of deposited layer metallization on dielectrics or interlayer stacking alignment.

McMahon U.S. Pat. No. 4,441,075 provides for a circuit arrangement enabling the testing of each individual chip and interchip connection in a high density packaging structure having a plurality of interconnected chips without any physical disconnection. However, there is no capability of providing for non-destructive testing of substrate interlayer shifting, or testing for misalignment or masking offsets relative to the filling of vias analogous in a manner provided for by the present invention.

SUMMARY OF THE INVENTION

Accordingly, in order to obviate or ameliorate the drawbacks and limitations of the prior art, applicants have developed a number of test structures which can be employed in order to provide, essentially non-destructively, visual and electrical test data concerning the alignment of electrically conductive and dielectric features which are deposited on multilayer substrates, and which are typically used in chip carrier packaging. These testing features can detect the alignment of metallized features placed on a single layer, as well as provide informative data regarding measureable misalignment of conductive features between layers of a potentiality which can detrimentally impact electrical reliability as well as electrical performance, particularly at very high frequencies where conductive feature-to-feature misalignment may at times produce detrimental signal reflections.

These alignment features can be readily incorporated into pattern deposition masks, such as silk-screening or metal masks employed to deposit conductive features on unfired greensheets using conductive metal pastes. These features can be structured to detect the amount of misalignment that is typically encountered due to mask-layer placement misalignment, greensheet distortion originating from handling, improper placement of via holes used to provide layer to layer electrical interconnectivity, and the like. These alignment features facilitate misalignment detection by means of visual or optical assessment of spacing violations or irregularities between deposited metallized or conductive features.

Applicants further provide inventive test features in the substrate capable of testing the alignment of layer to layer metallized features after the multilayer substrate has been assembled, and in some instances heated to consolidate the assemblage into an electrically functional electronic device, such as a semiconductor chip carrier. The test features allow the assessment of worst case layer misalignment, using surface pads which connect to electrically testable nets able to quantify the degree of (mis)alignment between any two layers, and which can also be used to provide informative data as to which layers of a multilayer laminate or substrate are misaligned.

The information which is acquired from these test features can be utilized to improve electrical manufacturing yields by early detection of conductive feature misalignment which can cause shorts and opens in the manufactured electrical device. The test data can also be used to provide diagnostics of pattern deposition equipment indicative of tooling wear, improper setup or other mechanical malfunctions encountered during production. For high frequency RF applications, typically above 10 GHz, where alignment of layers and features within the package is critical to minimize signal reflections that can adversely affect performance, the test features can be used to confirm the alignment of conductive features and provide monitors during the manufacturing process to quickly indicate potential alignment shifts. These test features would be made as through-via columns (top to bottom) in the substrate to maximize the stress on the via columns and test all the interfaces of the metallization within the substrate. In order to further stress the device, it may be subjected to a very low temperature prior to testing so as to still further stress the interfaces by maximizing the contraction of a metal via column due to CTE mismatch with the dielectric material of the substrate layers. This can be accomplished by immersion in liquid nitrogen or other suitable cryogenic media or methods. Electrical "opens" testing can be performed during the time the part is maintained at subambient temperatures.

During the subambient temperature or thereafter the "Top to Bottom" and "Top to Top" connections would be tested for latent opens signatures by known latent defect detection methods. This test structure can be provided for every substrate design and testing can be performed for every substrate. This is necessary since there is typically no traceability to a single laminate after singulation. There is also no simple, accurate non-destructive test available after laminating in order to assess feature to feature alignment.

Accordingly, it is an object of the present invention to provide test structures which will facilitate the obtaining, in non-destructive modes, visual and electrical test data regarding the alignment of electrically conductive and dielectric features which are incorporated within or deposited on multi-layer substrates.

Another object of the invention is to provide test features which can detect and impart informative data regarding measurable misalignment of conductive features on a single substrate layer, as well as intermediate multilayer interfaces of a substrate to ascertain electrical reliability and performance.

A further object resides in the provision of test features to detect the extent of misalignment encountered during mask-layer placement, greensheet or dielectric layer distortion and improper via placement wherein-the test features may be incorporated into pattern deposition masks, such as silk-screening and metal masks.

Yet another object resides in the provision of novel methods employed through the utilization of the test features as described herein in accordance with the invention.

BRIEF DESCRIPTION OF THE DRAWINGS

Reference may now be made to the following detailed description of preferred embodiments of the invention, taken in conjunction with the accompanying drawings; in which:

FIG. 2b illustrates a typical or allowable degree of misalignment in the vias formed in the different substrate layers of FIG. 1a; FIG. 2c illustrates a potential risk of electrical shorts or opens by an excessive offset of the vias in the successive substrate layers of FIG. 1a;

FIGS. 3a and 3b illustrate, respectively, test structures for assessing screening alignment for via fill and line deposition; in which FIG. 3a illustrates, in an exploded view, the different layer alignment and extent of misalignment of the via filled with paste connections; whereas

FIGS. 7a and 7b illustrate, respectively, the novel mask with the inventive alignment feature in FIG. 7a surrounding the via fill opening in the mask on a punched substrate greensheet; in which

FIG. 7e illustrates in an enlarged plan view, the mask of FIG. 7a over the via properly aligned to provide a fill as illustrated in FIGS. 7a and 7b; whereas

DETAILED DESCRIPTION OF PREFERRED EMBODIMENTS

Figure 1A:
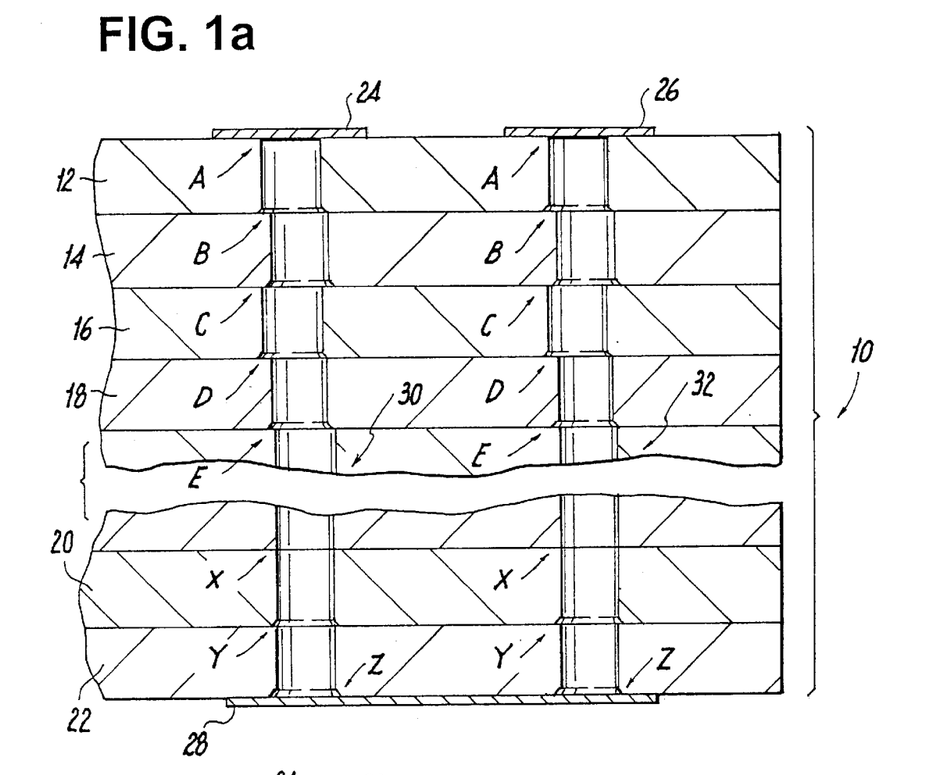
FIG. 1a illustrates the vertical sectional view through a portion of a multilayer substrate, such as a ceramic substrate, including test pads arranged in a corner of the substrate.

Reverting in specific detail to the drawings, FIG. 1 illustrates a vertical sectional view through some of the layers 12, 14, 16, 18—20 and 22 of a ceramic multilayer substrate 10, forming interfaces A, B, C, D, E—X; Y and through Z, and including top test pads 24 and 26 and a bottom test pad 28 wherein the bottom test pad 28 is a BSM shorted test pad.

Indicated by the through-via columns or stacks 30 and 32 in FIG. 1a, is the misalignment among the various layers 12, 14 and 16, whereas the layer pairs 16 and 18, as well as 20 and 22 are well aligned relative to each other.

As indicated, each through-via stack 30, 32 shows a degree of misalignment at the interfaces which is less than one-half (½) the diameter of the via, so as to essentially provide a permissible extent of misalignment; in effect, the functioning of the device would not be adversely affected.

Figure 1B:
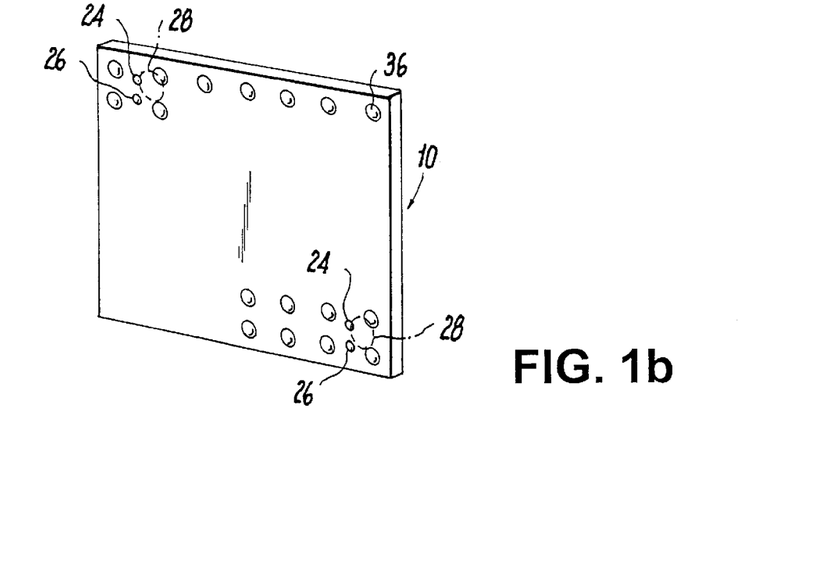
FIG. 1b illustrates the positioning of the test pads of FIG. 1a intermediate I/O pads on the substrate.

Referring to FIG. 1b, the test pads 24, 26, 28 are preferably located in the substrate corner region intermediate I/O pads 36, wherein the extreme corners are employed to maximize sensitivity, inasmuch as any misalignment is increased in its extent from the center of the substrate 10 towards the edges or corners thereof. Consequently, the use of the corners to show an allowable amount of misalignment by testing the electrical conductivity between the upper and lower test pads, is employed to permit dispositioning of the substrate 10 if necessary.

Figure 2A:
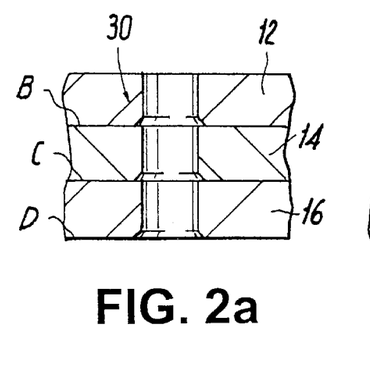
FIG. 2a illustrates an ideal alignment of the various layers in the substrate of FIG. 1a of the vias formed therein.
Figure 2B:
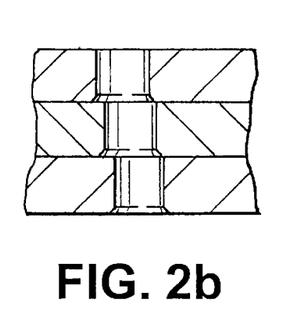
Figure 2C:
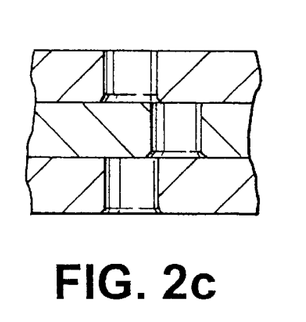

As shown in FIGS. 2a through 2c, FIGS. 2a and 2c illustrate respectively via alignment, or misalignment in the areas wherein FIG. 2a illustrates the ideal alignment of the layers 12, 14, 16 relative to a through-via stack 30. In that instance, there is practically no misalignment at the interfaces between adjacent layers, so as to thereby verify that there is a good degree of conductivity present between the various substrate layers and electrical lines.

As shown in FIG. 2b, in that instance there is a permissible extent of radial misalignment encountered in stacking between the successive layers 12, 14, and 14 and 16 of the through-via portions. However, each radial offset of adjacent layers is less than or only about one-half (½) the via diameter. This is a radial offset which misaligns the layers 12, 14, 16 to within a permissible degree, which will still enable proper and reliable functioning of the electrical components of the device.

With regard to the more extensive radial interlayer misalignment, as shown in FIG. 2c, there is a potential risk of operating failure or malfunctions, inasmuch as the uppermost layer 12 relative to the second layer 14 is offset about three-quarters (¾) the diameter of the via 30; while between the second layer 14 and the third layer 16 there is an offset of almost the entire via diameter. This degree of misalignment or radial offset can produce an electrical disconnection adversely affecting the reliable functioning of the device during intended operation.

As wiring density increases and at high frequencies smaller sized vias, for instance (1–3 mils in diameter), with less current carrying capacity, require an improved degree of interface alignment between substrate layers in order to avoid high frequency losses and internal substrate heating due to the lack of adequate contact areas being afforded in the continuity of the via stack through the collective substrate layers.

Figure 3A:
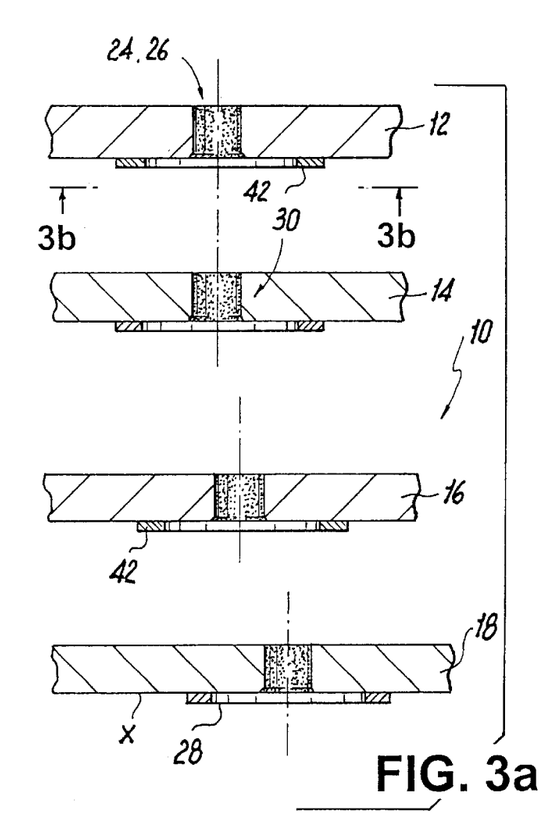
Figure 3B:
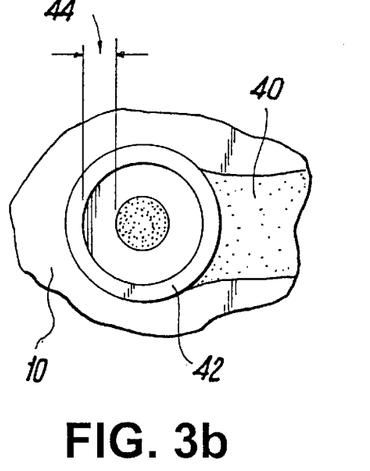
FIG. 3b illustrates, on an enlarged scale, a top plan view thereof.
Figure 4:
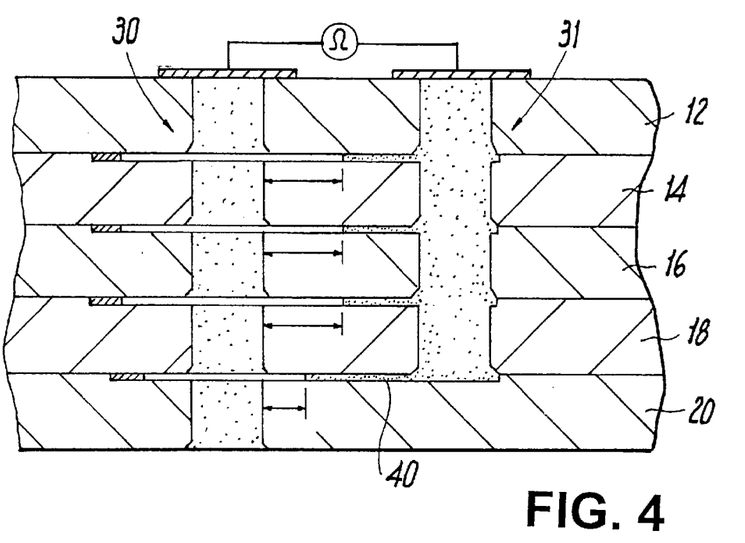
FIG. 4 illustrates, in a vertical sectional view, the connection of internal misalignment determination features of the conductive lines and vias intermediate the various layers with regard to surface metallized features.

Referring to FIGS. 3a, 3b and 4, presently vias 30 and conductive lines 40 are deposited in one pass on a greensheet. Ideally the registration between all of the deposited features on a single layer should be quite good. However due to greensheet movement and processing alignment variations adjacent layers at stack-up can misalign. The mask feature for ascertaining alignment between layers is shown in the form of a ring 42 with a gap around the via. The aligned via stack 30 is filled with conductive paste, and is connected to pads on the top of the substrate. A second via stack 31 is also deposited on each layer with lines 40 and alignment test feature 42 being deposited on each layer. Via stack 31 is connected to a test feature on the top of the substrate. The gap 44 within mask ring 42 provides indication and data as to misalignment between adjacent layers through thickness of substrate 10. Separate via and pattern screening passes may be employed for other products, and the inclusion of a ring structure 42 as shown in FIGS. 3b and included on layers 12, 14, 16 and 18 would allow determination of screening misalignment and layer stacking errors. By electrically probing the surface pads of adjacent test structure via stacks of FIG. 4 any adjacent layers or via stacks which are misaligned sufficiently to cause the via 30 to contact outer ring 42 will produce a continuous electrical path between the surface pads. The radial misalignment detection capability requires only a few test structures located at the corners of each device, and also may be designed to permit different degrees of misalignment to be analyzed within a device, whereby shifts during manufacturing processing can be readily and rapidly detected. This is implemented by changing the gap 44 between the via 30 and the detection ring 42 as illustrated in FIG. 4 of the drawings, and at the layer 16–18 interface and the layer 18–20 interface. Thus, further multiple features may be incorporated for determining the degree of alignment or misalignment at each successive layer interface. Of course multiple test features with different degrees of misalignment sensitivity can also be placed on any layer.

Figure 5A:
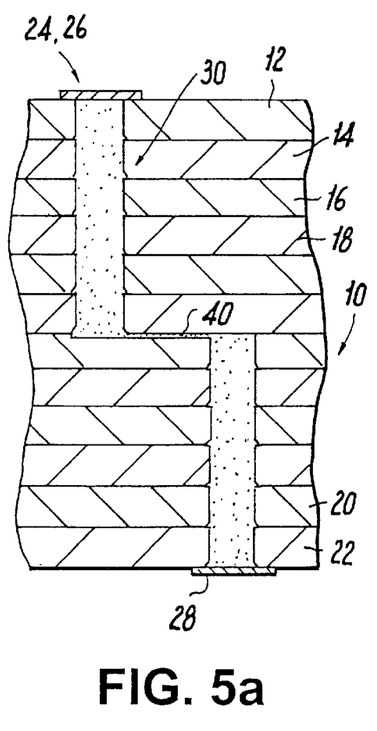
FIG. 5a illustrates the line bending test features of, respectively, a through-via stack presintered, top to bottom; whereas in FIG. 5b there is disclosed a through-via stack post-sintered, including an electrical test for signal integrity from top to bottom.
Figure 5B:
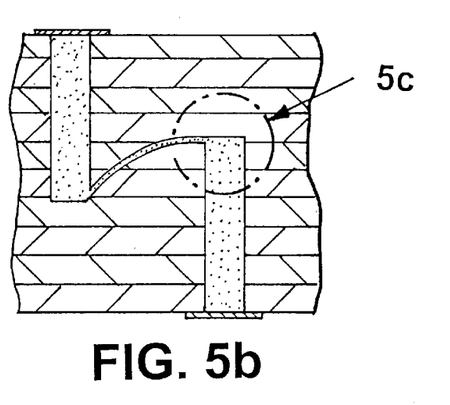
Figure 5C:
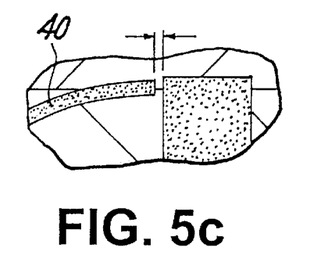

Moreover, other test structures can be employed in the substrate 10 to assess the degree of line bending, after sintering of cofired ceramic substrates or lamination of organic dielectric layers, as shown in FIG. 5a of the drawings, wherein bending is encountered due to extremely long via stack lengths, so that these can be made to assess microstructural uniformity of the sintering or lamination process and material compatibility. As shown in FIG. 5a and 5b, wherein there is shown an example of the structure used for line bending measurements, the greater the length of the via column, the greater is the stress on the via to the line interconnect and the greater the sensitivity to potential problems caused; for example, as shown in FIG. 5b, by sintering behavior (impurities, powder metal sintering control variations and the like), furnace atmosphere abnormalities, excessive lamination temperatures and/or pressure and the like. The line width or widths can also be changed; i.e. made in a range of widths, so as to increase the sensitivity of the line to the via to failure. The thinner the line, typically the more sensitive it is to failure. This type of test structure is particularly useful for large, thick high value laminates, which are at greater risk to this type of defect. Pads 24 and 28 terminations are used to electrically test continuity of the line bending on the substrate surfaces. To increase the sensitivity of the electrical testing the device can be electrically tested at temperature below ambient, typically <−50° C. to increase the CTE mismatch of the metal to dielectric at the interface and provide early detection of latent defects by stressing the line to open.

Figure 6A:
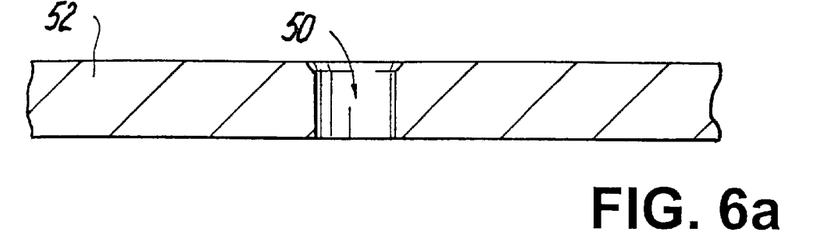
FIGS. 6a through 6c illustrate, in sequence, the filling of vias, showing the procedure in providing the mask opening with a properly aligned mask relative to the greensheet feature.
Figure 6B:
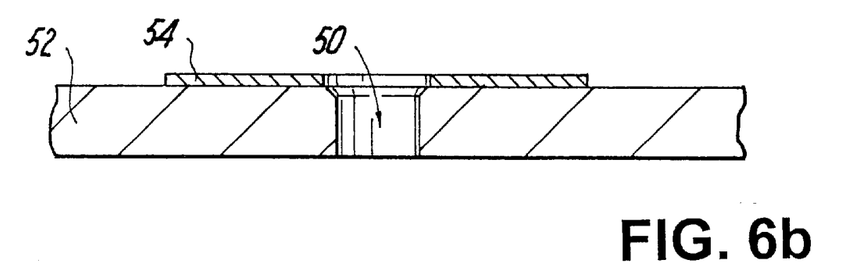
Figure 6C:
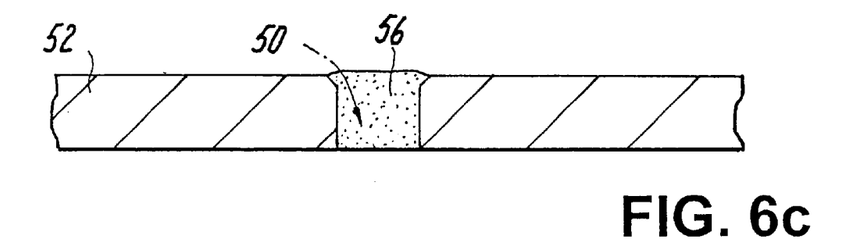
Figure 6D:
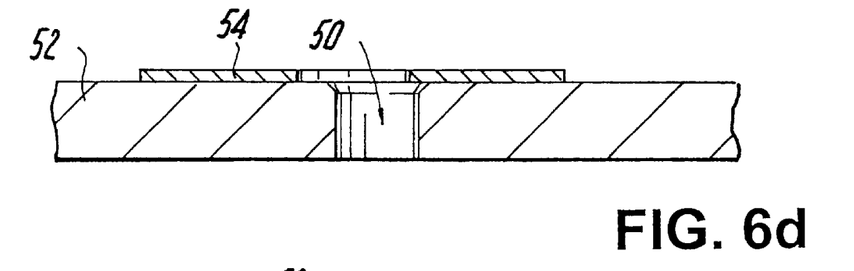
FIGS. 6d and 6e illustrate, in sequence, the placement of a misaligned mask relative to the greensheet feature showing the improperly filled via.
Figure 6E:
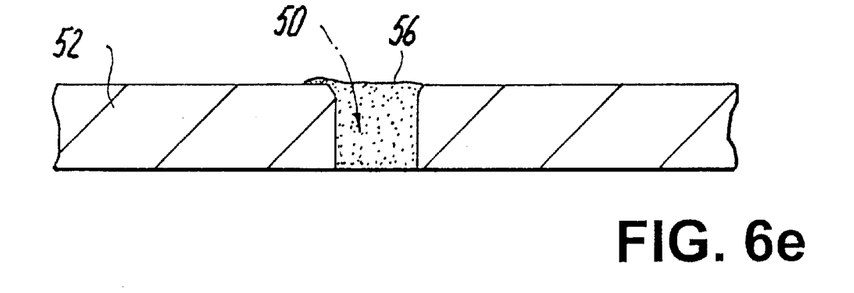

As described with regard to testable structures, FIGS. 6a through 6e, and FIGS. 7a and 7f show visual and electrical test configuration for screening misalignment on an individual dielectric layer. In the embodiment of FIGS. 6a through 6e, there is shown a punched via 50 in a substrate 52. FIG. 6b shows a well aligned mask 54 positioned over the via and FIG. 6c shows the via 50 after filling it with a conductive paste 56. In contrast, FIG. 6d shows a poorly aligned or misaligned mask-to-via with FIG. 6e illustrating the resultant offset and irregular fill of the paste through the mask into the via and on oversize via surface features.

Figure 7A:
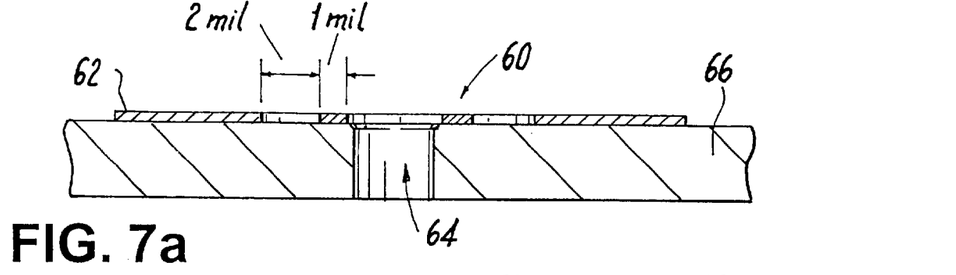
Figure 7B:
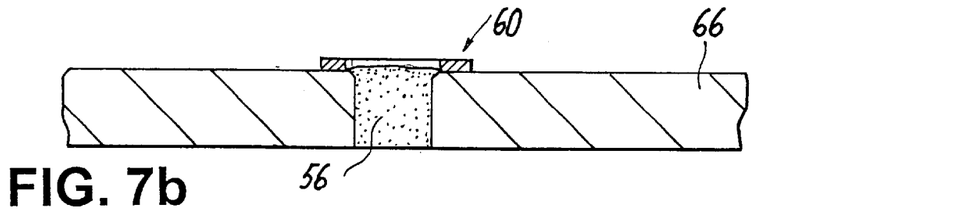
FIG. 7b illustrates the filled via and alignment feature with paste filled through the mask.
Figure 7C:
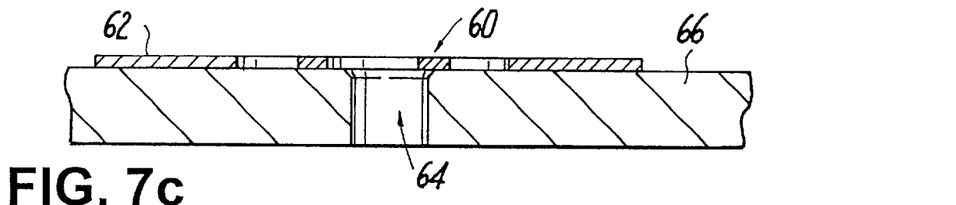
FIGS. 7c and 7d illustrates, respectively, a misaligned mask relative to the via hole, and the filled via with the misaligned mask showing the irregularity in the deposition of the paste fill material.
Figure 7D:
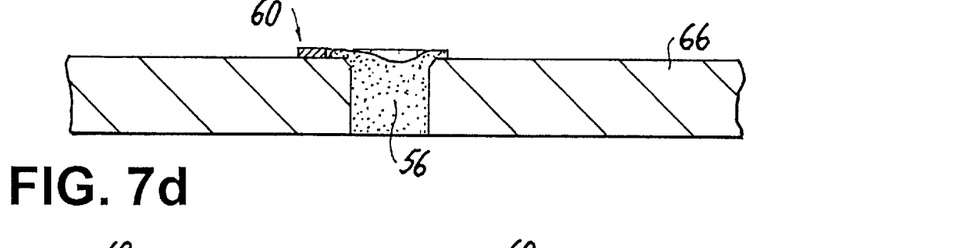
Figure 7E:
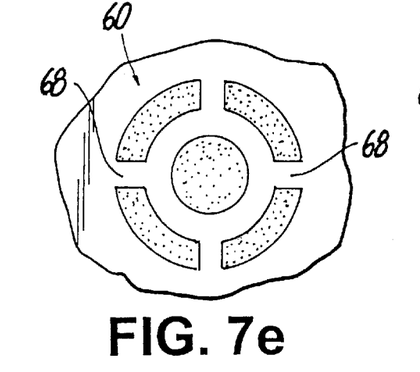
Figure 7F:
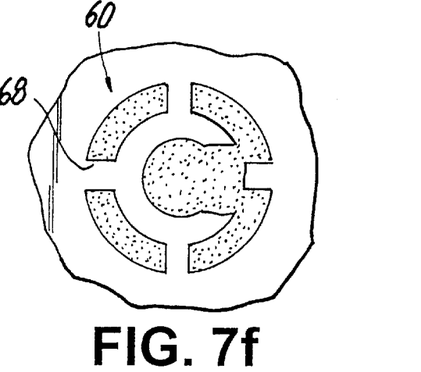
FIG. 7f illustrates a plan view of a misaligned mask showing the irregular fill of FIG. 7d.

FIGS. 7a through 7f show the proposed test structure that would provide a 1 mil wide ring-shaped visual and electrical separation of mask 62 to via 64 misalignment. In FIG. 7a and 7b there is shown to be a good alignment between the alignment test features 60 deposited by mask alignment rings 61 in the mask 62 and the greensheet 66. Screening this mask region centered over a punched via 54 in a greensheet 66 with paste will produce a filled via and a segmented ring around the via which will not be shorted together. Contrastingly, in FIG. 7c the mask opening is not well aligned with the via. Screening this mask region with paste will cause some of the paste to flow under the 1 mil wide mask ring 61 and short the via 54 to the alignment test feature 60, as can be seen in FIG. 7d. If electrical connections are made to the outer alignment feature and conducted by vias to the surface of the parts, the alignment can be confirmed by testing for continuity between the via and the outer ring or ring segments. FIGS. 7e and 7f show examples of, respectively, well aligned and misaligned screened features from, respectively, FIGS. 7b and 7d on the greensheet. The width of the space between the vias and ring-shaped alignment features produced by mask ring 60 can be changed to adjust the sensitivity of the structure to misalignment detection.

These test structures 60 would ideally be located on the perimeter or edge portions of the layers or substrate patterns to provide the maximum sensitivity to screening misalignment. They could be outside the electrically active wiring area for visual detection or within the substrate for electrical testing.

In particular, as shown in FIGS. 7a and 7b, a ring-shaped mask 62 with alignment feature 60 surrounding the via fill opening is provided and positioned on the substrate or greensheet 66, and thereafter, as shown in FIG. 7b, the appropriate paste 56 is applied through the mask filling the via 64 and alignment feature 60. The filled vias and alignment surface features are well aligned, showing the proper positioning of the paste and ring, as verified by the plan view of FIG. 7e of the drawings.

To the contrary, a misalignment as shown in FIGS. 7c and 7d of the drawings of the mask 62 with feature 60 relative to the greensheet 66 over the via hole will cause the paste to flow under mask feature 61 into the space formed between the via opening and the greensheet, and thereby upon filling the via with the paste, and removal of the mask it is clearly indicated visually that there is a misalignment and the fill is improper, as shown in FIG. 7f of the drawings. Consequently, this may provide a flow of the conductive material in a direction so as to adversely affect any electrical interconnects between the via and electrical lines.

The surface test pads for testing electrically are preferably made approximately 4–12 mils in diameter so that they can be easily probed. The pads can be located and designed as fiducials between I/O pads on the bottom of the device so as to minimize area consumption used for I/O connections. Wiring can connect from the pads to the edge of the device to pass outside the "active area", if desired.

Another method to allow the detection of misaligned layers at stacking is by punching a set of vias "off grid" by a fixed amount. These would be connected to the surface of the substrate and misalignment between layers would be detected by the opening of a circuit when the vias are so misaligned that they no longer make electrical contact.

A drawback of this technique is that the planar detection of misalignment is not 360 degrees (radially) unless a larger number of vias are used.

This technique can also be cumbersome during manufacturing when using an fixed tooling since the "off grid" vias usually need to be punched separately with an adverse impact on machine efficiency. A gang punch can be made to have all these "off grid" via in the design more efficiently.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of non-destructively electrically testing the integrity of a multilayer electrical device; said method comprising:

(a) locating a first electrical test structure at one surface of said multilayer device; and (b) locating a second electrical test structure at an opposite surface of said multilayer device, having said second electrical test structure in electrical communication with said first electrical test structure, whereby application of an electrical potential between said first and second electrical test structures facilitates detection and assessment of potential electrical interface failure sites in said multilayer device;

at least two spaced vias extend through said multilayer device between said one and said opposite surfaces;

said first electrical test structure comprising a first test pad electrically communicating with a first said via at said one surface and a second test pad electrically communicating with a second said via at said one surface;

and said second electrical test structure comprising a test pad in common electrical communication with said first and second vias at said opposite surface of said multilayer electrical device;

said vias each comprising a via stack extending through said multilayer electrical device, and means for subjecting said device to thermal cycling stressing the interfaces of the layers of said device for detection of potentially latent defects tending to produce electrical opens and failure of the device.

2. An electrical testing method as claimed in claim 1, wherein said via to via electrical testing provides an assessment of interlayer alignment at layer interfaces within said multilayer electrical device.

3. An electrical testing method as claimed in claim 1, wherein said multilayer electrical device includes a plurality of I/O pads distributed about the surface of said device, said electrical test pads on said device surfaces being located intermediate at least some of said I/O pads.

4. An electrical testing method as claimed in claim 3, wherein said electrical test pads are arranged proximate corner or edge regions or said multilayer electrical device.

5. An electrical testing method as claimed in claim 1, wherein said means utilizes cryogenic thermal excursions at subambient temperatures to stress the via stacks and device for the detection of said latent defects.

6. An electrical testing method as claimed in claim 1, wherein said first and second test pads each comprises a ring structure extending about the opening or interfaces or interface of a therewith associated via stack so as to form detection means for assessing layer to layer, via to conductive line, and via to via alignment data indicative of the electrical integrity of said device.

7. An electrical testing method as claimed in claim 6, wherein said ring structures are interposed at via stack interfaces between adjacent layers of said device, said ring structures being in electrically conductive communication with said first and second electrical test pads so as to facilitate shorting of via to ring structure at test pads responsive to excessive misalignment between adjacent layers of said device.

8. An electrical testing method as claimed in claim 7, wherein said vias are filled with a conductive material to provide for an electrical path between said layers.

9. An electrical testing method as claimed in claims 6, wherein said method tests conductive line bending within the layer interfaces of said device responsive to said device being subjected to densification processes to produce multilayer electronic devices.

10. An electrical testing method as claimed in claim 6, wherein said ring structure is formed in a mask extending about the via opening so as to assess deposited features to substrate greensheet misalignment during filling of the via with a conductive material.

11. An electrical testing method as claimed in claim 10, wherein said ring structure is connected to the mask by webs so as to form an annular space facilitating visual information as to any misalignment between the mask and the greensheet positioned therebelow.

12. An electrical testing method as claimed in claim 1, wherein said multilayer electrical device comprises a cosintered ceramic substrate.

13. An electrical testing method as claimed in claim 1, wherein said method is adapted to monitor manufacturing tooling and processes for said multilayer electrical device.

14. An arrangement for non-destructively electrically testing the integrity of a multilayer electrical device; said arrangement comprising:

(a) a first electrical test structure being located at one surface of said multilayer device; and (b) a second electrical test structure being located at an opposite surface of said multilayer device, said second electrical test structure being in electrical communication with said first electrical test structure, whereby application of an electrical potential between said first and second electrical test structures facilitates detection and assessment of potential electrical interface failure sites in said multilayer device.

(c) at least two spaced vias extending through said multilayer device between said one and said opposite surfaces;

said first electrical test structure comprising a first test pad electrically communicating with a first said via at said one surface and a second test pad electrically communicating with a second said via at said one surface;

and said second electrical test structure comprising a test pad in common electrical communication with said first and second vias at said opposite surface of said multilayer electrical device;

said vias each comprising a via stack extending through said multilayer electrical device, and means for subjecting said device to thermal cycling stressing the interfaces of the layers of said device for detection of possible failure sites in said multilayer device.

15. An electrical testing arrangement as claimed in claim 14, wherein said via to via electrical testing provides an assessment of interlayer alignment at layer interfaces within said multilayer electrical device.

16. An electrical testing arrangement as claimed in claim 14, wherein said multilayer electrical device includes a plurality of I/O pads distributed about the surface of said device, said electrical test pads on said device surfaces being located intermediate at least some of said I/O pads.

17. An electrical testing arrangement as claimed in claim 16, wherein said electrical test pads are arranged proximate corner or edge regions of said multilayer electrical device.

18. An electrical testing arrangement as claimed in claim 14, wherein said means utilizes cryogenic thermal excursions at subambient temperatures to stress the via stacks and device for the detection of said latent defects.

19. An electrical testing arrangement as claimed in claim 14, wherein said first and second test pads each comprises a ring structure extending about the opening or interface of a therewith associated via stack so as to form detection means for assessing layer to layer, via to conductive line, and via to via alignment data indicative of the electrical integrity of said device.

20. An electrical testing arrangement as claimed in claim 19, wherein said ring structures are interposed at via stack interfaces between adjacent layers of said device, said ring structures being in electrically conductive communication with said first and second electrical test pads so as to facilitate shorting of via to ring structure at test pads responsive to excessive misalignments between adjacent layers of said device.

21. An electrical testing arrangement as claimed in claim 20, wherein said vias are filled with a conductive material to provide for an electrical path between said layers.

22. An electrical testing arrangement as claimed in claim 19, wherein said arrangement tests conductive line bending within the layer interfaces of said device responsive to said device being subjected to densification processes to produce multilayer electronic devices.

23. An electrical testing arrangement as claimed in claim 19, wherein said ring structure is formed in a mask extending about the via opening so as to assess deposited features to substrate dielectric layer misalignment during filling of the via with a conductive material.

24. An electrical testing arrangement as claimed in claim 23, wherein said ring structure is connected to the mask by webs so as to form an annular space facilitating visual information as to any misalignment between the mask and the greensheet positioned therebelow.

25. An electrical testing arrangement as claimed in claim 14, wherein said multilayer electrical device comprises a cosintered ceramic substrate.

26. An electrical testing arrangement as claimed in claim 14, wherein said arrangement is adapted to monitor manufacturing tooling and processes for said multilayer electrical device.

* * * * *